(12) United States Patent
Choi et al.

(10) Patent No.: US 11,990,179 B2
(45) Date of Patent: May 21, 2024

(54) MEMORY DEVICE USING A PLURALITY OF SUPPLY VOLTAGES AND OPERATING METHOD THEREOF

(71) Applicant: Samsung Electronics Co., Ltd., Suwon-si (KR)

(72) Inventors: Taemin Choi, Seoul (KR); Taehyun Kim, Seoul (KR); Seongook Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 195 days.

(21) Appl. No.: 17/478,629

(22) Filed: Sep. 17, 2021

(65) Prior Publication Data
US 2022/0115060 A1 Apr. 14, 2022

(30) Foreign Application Priority Data

Oct. 14, 2020 (KR) .................. 10-2020-0132980
Feb. 5, 2021 (KR) .................. 10-2021-0016841

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
USPC ........................................ 365/154
See application file for complete search history.

(56) References Cited

U.S. PATENT DOCUMENTS

| 8,223,570 | B2 | 7/2012 | Kushida |
| 8,279,687 | B2 | 10/2012 | Adams et al. |
| 8,971,133 | B1 * | 3/2015 | Zheng .................. G11C 7/12 365/194 |
| 9,001,572 | B2 | 4/2015 | Choi et al. |
| 9,123,439 | B2 | 9/2015 | Pilo |
| 9,171,610 | B2 | 10/2015 | Choi |
| 9,177,635 | B1 | 11/2015 | Evans et al. |

(Continued)

FOREIGN PATENT DOCUMENTS

| KR | 100567356 B1 | 4/2006 |
| KR | 102123056 B1 | 6/2020 |

OTHER PUBLICATIONS

Clinton, Michael, et al. "12.3 A low-power and high-performance 10nm SRAM architecture for mobile applications," Solid-State Circuits Conference (ISSCC), 2017 IEEE International. IEEE, 2017.

*Primary Examiner* — Sung Il Cho
(74) *Attorney, Agent, or Firm* — Muir Patent Law, PLLC

(57) ABSTRACT

A memory device accessed by circuits operating based on a first supply voltage. The memory device includes a cell array electrically connected to a plurality of word lines and a plurality of bit lines; a row driver configured to select one word line of the plurality of word lines based on a row address; a precharge circuit configured to precharge the plurality of bit lines based on the first supply voltage; a column driver configured to select at least one bit line of the plurality of bit lines based on a column address; and a read circuit configured to read data stored in the cell array through the at least one bit line. The cell array, the row driver, the column driver, and the read circuit operate based on a second supply voltage, which is higher than the first supply voltage.

6 Claims, 10 Drawing Sheets

(56) References Cited

U.S. PATENT DOCUMENTS

| | | | |
|---|---|---|---|
| 9,251,889 B2* | 2/2016 | Goel | G11C 11/418 |
| 10,008,261 B2 | 6/2018 | Menezes | |
| 2014/0269112 A1* | 9/2014 | Jung | G11C 7/12 |
| | | | 365/189.11 |
| 2015/0279452 A1* | 10/2015 | Yoon | G11C 11/419 |
| | | | 365/154 |
| 2019/0147942 A1* | 5/2019 | Jain | G11C 11/419 |
| | | | 365/156 |

* cited by examiner

MEMORY DEVICE USING A PLURALITY OF SUPPLY VOLTAGES AND OPERATING METHOD THEREOF

CROSS-REFERENCE TO RELATED APPLICATIONS

This application is based on and claims priority under 35 U.S.C. § 119 to Korean Patent Application Nos. 10-2020-0132980 filed on Oct. 14, 2020 and 10-2021-0016841 filed on Feb. 5, 2021, in the Korean Intellectual Property Office, the disclosures of which are incorporated by reference herein in their entirety.

BACKGROUND

The inventive concept relates to a memory device and an operating method thereof, and more particularly, to a memory device accessed by circuits which operate by using a plurality of supply voltages, and an operating method thereof.

Due to a demand for a high degree of integration and development of semiconductor processes, a width, interval, and/or height of wirings included in an integrated circuit may be decreased, and parasitic elements of the wirings may be increased. Parasitic elements of the wirings may include an unwanted resistance, capacitance, or inductance possessed by the wirings. In addition, for reduced power consumption, higher operation speed, etc., a power supply voltage of an integrated circuit may be reduced and accordingly, the effects on an integrated circuit due to parasitic elements of wirings may become more significant.

Despite such parasitic elements, an integrated circuit including a cell array consisting of memory cells may be required to stably provide high performance according to requirements of various applications. In particular, a voltage supplied to a System-on-Chip (SoC) may be reduced to minimize energy consumption by a memory device.

SUMMARY

Aspects of the inventive concept provide a memory device which reduces energy consumption and stably provides high performance when performing operations of data writing or reading, and an operating method thereof.

According to an aspect of the inventive concept, there is provided a memory device which is accessed by circuits operating based on a first supply voltage, the memory device including: a cell array electrically connected to a plurality of word lines and a plurality of bit lines; a row driver configured to select one of the plurality of word lines based on a row address; a precharge circuit configured to precharge the plurality of bit lines based on the first supply voltage; a column driver configured to select at least one bit line of the plurality of bit lines based on a column address; and a read circuit configured to read data stored in the cell array through at least one bit line, wherein the cell array, the row driver, the column driver, and the read circuit operate based on a second supply voltage, which is higher than the first supply voltage.

According to another aspect of the inventive concept, there is provided a memory device which is accessed by circuits operating based on a first supply voltage, the memory device including: a cell array electrically connected to a plurality of word lines and a plurality of bit lines; a row driver configured to select one of the plurality of word lines based on a row address; a precharge circuit configured to precharge the plurality of bit lines based on the first supply voltage; a column driver configured to select at least one bit line of the plurality of bit lines based on a column address; and a write circuit configured to write data to the cell array through at least one bit line, wherein the cell array, the row driver, the column driver, and the write circuit operate based on a second supply voltage, which is higher than the first supply voltage.

According to another aspect of the inventive concept, there is provided an operating method of a memory device accessed by circuits operating based on a first supply voltage, the operating method includes: precharging a plurality of bit lines electrically connected to a cell array based on the first supply voltage; selecting one of a plurality of word lines electrically connected to the cell array based on a second supply voltage, which is higher than the first supply voltage; selecting at least one of the plurality of bit lines based on the second supply voltage; and reading data from the cell array through at least one bit line based on the second supply voltage.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
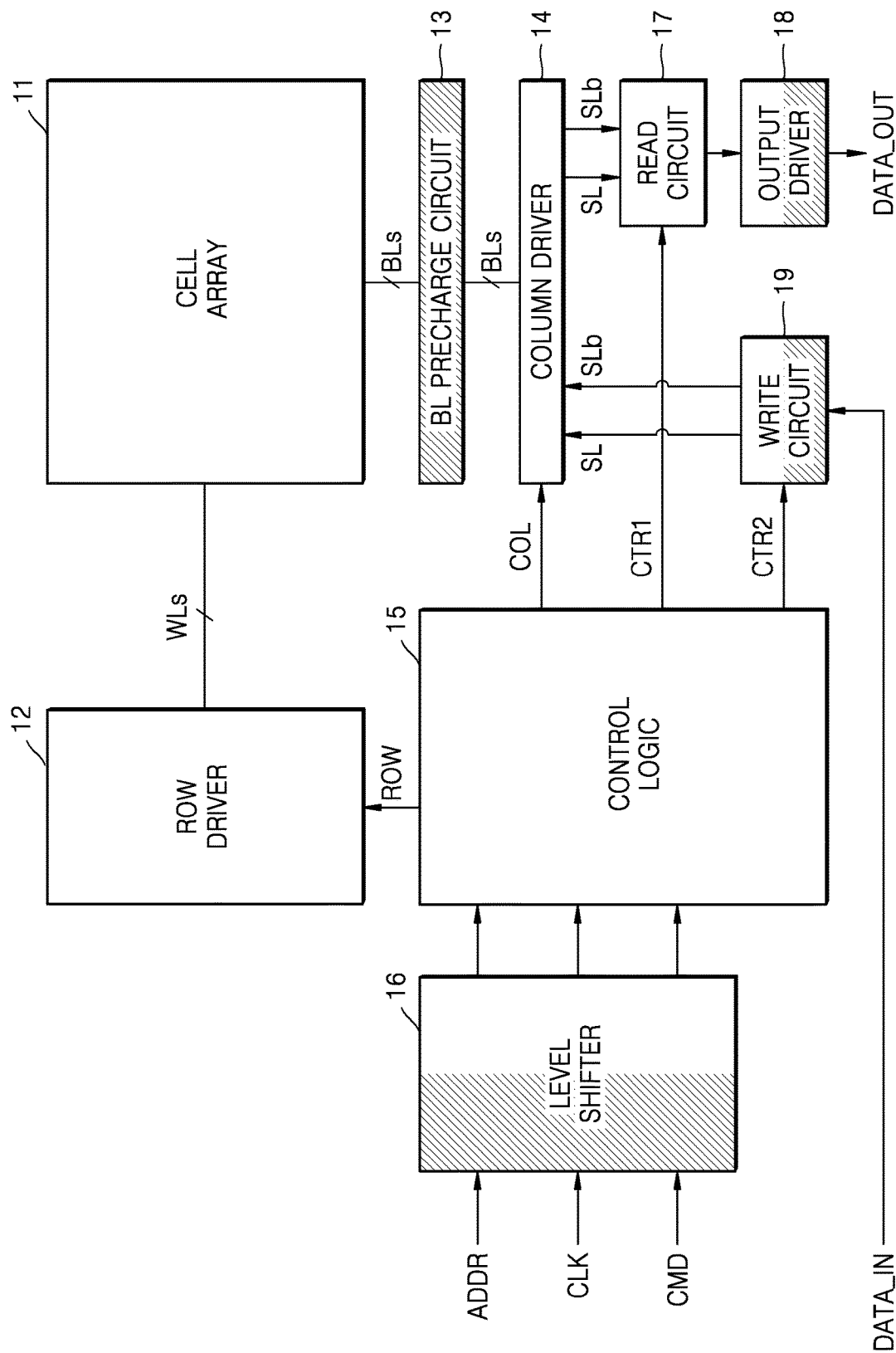
FIG. 1 is a block diagram of a memory device according to an example embodiment.

FIG. 1 is a block diagram of a memory device 10 that may be included in an integrated circuit according to an example embodiment. In some embodiments, the integrated circuit may store data based on commands and addresses provided from the outside of the integrated circuit, and the memory device 10 may be a standalone memory device. Also, in some embodiments, the integrated circuit may further include other components configured to write data to the memory device 10 or configured to read data from the memory device 10, as described below with reference to FIG. 10, and the memory device 10 may be an embedded memory device. As illustrated in FIG. 1, the memory device 10 may include a cell array 11, a row driver 12, a bit line precharge circuit 13, a column driver 14, a control logic 15, a level shifter 16, a read circuit 17, an output driver 18, and a write circuit 19. In some embodiments, the memory device 10 may further include an address buffer, a data buffer, a data input/output circuit, an internal voltage generator, and a pulse generator although they are not explicitly shown in FIG. 1. In the following embodiments, a first supply voltage may be a voltage that operates an external circuit of the memory device 10, and a second supply voltage may be a voltage higher than the first supply voltage. It will be understood that, although the terms first, second, third, etc. may be used herein to describe various elements, components, and/or sections, these elements, components, and/or sections should not be limited by these terms. Unless the context indicates otherwise, these terms are only used to distinguish one element, component, or section from another element, component, or section, for example as a naming convention. Thus, a first element, component, or section discussed below in one section of the specification could be termed a second element, component, or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The memory device 10 may receive a command CMD, an address ADDR, a clock signal CLK, write data DATA_IN and read data DATA_OUT. For example, the memory device 10 may receive a command CMD requesting a write (it may be referred to as a write command), an address (it may be referred to as a write address) and write data DATA_IN, and store the write data DATA_IN in an area of the cell array 11 corresponding to the address. In addition, the memory device 10 may receive a command CMD requesting a read (it may be referred to as a read command) and an address (it may be referred to as a read address), and output to the outside the read data DATA_OUT stored in an area of the cell array 11 corresponding to the address.

The cell array 11 may include a plurality of memory cells accessed by word lines and bit lines, respectively. In some embodiments, the memory cells included in the cell array 11 may be volatile memory cells such as a static random access memory (SRAM), dynamic random access memory (DRAM), etc. In some embodiments, the memory cells included in the cell array 11 may be non-volatile memory cells such as a flash memory, resistive random access memory (RRAM), etc. Example embodiments of the inventive concept will be described by mainly referring to SRAM cells; however, the example embodiments are not limited thereto.

With reference to FIG. 1, the cell array 11 may include a plurality of memory cells. Each of the plurality of memory cells may be electrically connected to one of a plurality of word lines WLs, and to at least one of a plurality of bit lines BLs. As used herein, items described as being "electrically connected" are configured such that an electrical signal can be passed from one item to the other. Items as described herein may be electrically connected through physical connections, such as pads, wirings/lines, terminals, etc. The physical connections may be formed of a conductive material, such a metal, for example.

The row driver 12 may be electrically connected to the cell array 11 through the plurality of word lines WLs. The row driver 12 may activate one word line of the plurality of word lines WLs based on a row address ROW. Accordingly, among the plurality of memory cells, the memory cells electrically connected to an activated word line may be selected. For example, the row driver 12 may select any one of the plurality of word lines WLs.

The bit line precharge circuit 13 may be electrically connected to the cell array 11 through the plurality of bit lines BLs. The bit line precharge circuit 13 may precharge the plurality of bit lines BLs. The plurality of bit lines BLs may include bit lines electrically connected to both ends of the memory cell and a bit line bar which is complementary to the bit lines.

The column driver 14 may be electrically connected to the bit line precharge circuit 13 through the plurality of bit lines BLs. The column driver 14 may select at least one bit line of the plurality of bit lines BLs based on a column address COL. As at least one bit line is selected from the plurality of bit lines BLs, the memory cells electrically connected to the selected bit line may also be selected among the plurality of memory cells. The at least one bit line may include a first bit line SL and a second bit line SLb complementary to the first bit line SL. The first bit line SL and the second bit line SLb may be electrically connected to both ends of the memory cell of the cell array 11.

The control logic 15 may receive a command CMD, an address ADDR, and a clock signal CLK, and generate a row address ROW, a column address COL, a first control signal CTR1, and a second control signal CTR2. For example, the control logic 15 may identify a read command by decoding the command CMD, and generate the row address ROW, the column address COL and the first control signal CTR1 to read the read data DATA_OUT from the cell array 11. Further, the control logic 15 may identify a write command by decoding the command CMD, and generate the row address ROW, the column address COL and the second control signal CTR2 to write the write data DATA_IN to the cell array 11. The first control signal CTR1 may be referred to as a "sensing enable signal," and the second control signal CTR2 may be referred to as a "write pulse." The control logic 15 may form a write pulse based on write enable signals included in the command CMD and pulse signals generated in the control logic 15.

The level shifter 16 may receive the command CMD, address ADDR, and clock signal CLK, and shift voltage levels of the command CMD, address ADDR and clock signal CLK to transmit them to the control logic 15. For example, the level shifter 16 may be used to shift input signals having a relatively low voltage to output signals having a relatively high voltage. For example, in the case of dual rail SRAM, to operate it with low power, the control logic 15 may be operated based on a low voltage. In addition, by arranging the level shifter for each signal input to the cell array 11, allowing the cell array 11 to operate based on a high voltage, the performance of the dual rail SRAM may be improved. In this embodiment, when the memory device 10 is accessed by the circuits operating based on the first supply voltage, the input signals (i.e., CMD, ADDR, CLK) input to the level shifter 16 may have a level of the first supply voltage, and the output signals output by the level shifter 16 may have a level of the second supply voltage. Accordingly, as the input signals transmitted to the control logic 15 may have a level of the second supply voltage, the output signals generated by the control logic 15, i.e., the row address ROW, the column address COL, the first control signal CTR1 and the second control signal CTR2, may also have the level of the second supply voltage. Thus, the cell array 11 and the word lines WLs may operate based on the second supply voltage. On the other hand, the bit line precharge circuit 13 may operate based on the first supply voltage. The bit line precharge circuit 13 may operate based on the first supply voltage, whereas the cell array 11, the row driver 12, the column driver 14, the control logic 15, the level shifter 16, the read circuit 17, the output driver 18, and the write circuit 19 may operate based on the second supply voltage, allowing an improved performance of the memory device 10 and reduced power consumption. Further, as the level shifter 16 is used when the input signals (CMD, ADDR, CLK) are input to the memory device 10, additional level shifters electrically connected separately to the word lines WLs to operate the word lines WLs based on the second supply voltage may be omitted. Therefore, the space efficiency of the memory device 10 may be increased.

By sensing a current and/or voltage received through the plurality of bit lines BLs at the time of performing a read operation, the read circuit 17 may identify values stored in the memory cells electrically connected to the activated word line (i.e., selected memory cells) and output the read data DATA_OUT based on the identified values. The read circuit 17 may be electrically connected to the column driver 14 through at least one of the plurality of bit lines BLs. The at least one bit line may include the first bit line SL and the second bit line SLb complementary to the first bit line SL. The read circuit 17 may include a sense amplifier. The read circuit 17 may receive the first control signal CTR1 from the control logic 15. The first control signal CTR1 may have the level of the second supply voltage. The read circuit 17 may sense a voltage difference between the first bit line SL and the second bit line SLb, and amplify the sensed voltage difference. In this embodiment, the read circuit 17 may amplify a voltage difference having the first supply voltage and a ground voltage to a voltage difference having the second supply voltage and the ground voltage. The read circuit 17 may reduce a sense amplifier delay by shifting the first supply voltage to the second supply voltage. Accordingly, the speed of the read operation by the memory device may increase.

The output driver 18 may receive amplified signals from the read circuit 17 and output the read data DATA_OUT to the outside of the memory device 10. The output driver 18 may convert a signal having a level of the second supply voltage to the read data DATA_OUT having a level of the first supply voltage.

The write circuit 19 may apply a current and/or voltage to the plurality of bit lines BLs based on the write data DATA_IN at the time of performing a write operation, and write values to the memory cells electrically connected to the activated word line, i.e., selected memory cells. The write circuit 19 may be electrically connected to the column driver 14 through at least one of the plurality of bit lines BLs. The at least one bit line may include the first bit line SL and the second bit line SLb. The write circuit 19 may write the write data DATA_IN to the cell array 11 based on the second supply voltage. The write circuit 19 may receive the second control signal CTR2 having the level of the second supply voltage from the control logic 15. In this embodiment, the write circuit 19 may include a level shifting circuit and a write driver. The level shifting circuit and the write driver will be explained below.

In this embodiment, the memory device 10 accessed by the circuits operating based on the first supply voltage may shift input signals (CMD, ADDR, CLK) having the level of the first supply voltage to the level of the second supply voltage through the level shifter 16. Therefore, the memory device 10 may have a stable and high performance. In addition, as the bit line precharge circuit 13 operates based on the first supply voltage, when the memory device 10 operates, the power consumption may be reduced.

Figure 2:
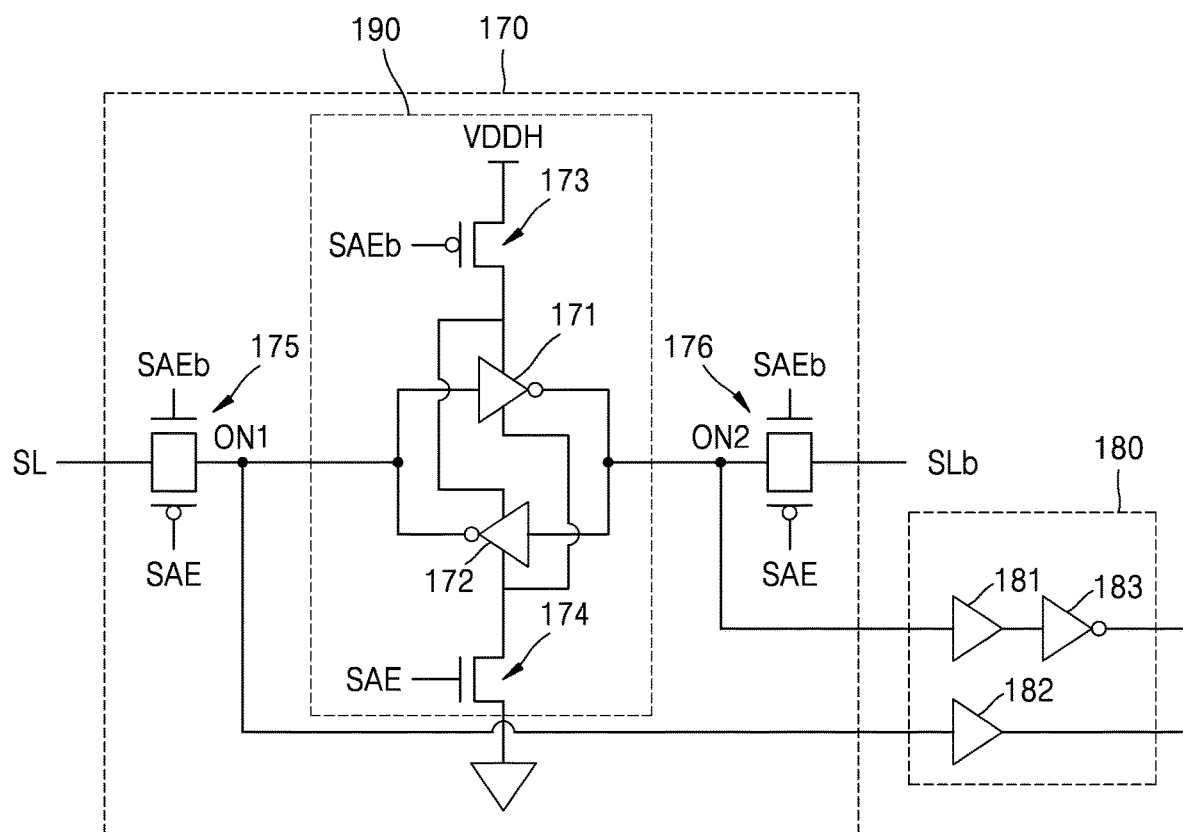
FIG. 2 is a circuit diagram illustrating a read circuit and an output driver according to an example embodiment.

FIG. 2 is a circuit diagram schematically showing a read circuit 170 and an output driver 180, corresponding to the read circuit 17 and the output driver 18 of FIG. 1, according to an example embodiment. The read circuit 170 and the output driver 180 may be electrically connected.

The read circuit 170 may include a sense amplifier 190. The sense amplifier 190 may include a first inverter 171 and a second inverter 172 which are cross coupled. The first inverter 171 and the second inverter 172 may be electrically connected to a first transistor 173 and a second transistor 174. The first transistor 173 may provide a second supply voltage VDDH to the first inverter 171 and the second inverter 172. The first transistor 173 may operate based on a second sensing enable signal SAEb. The second sensing enable signal SAEb may be an inverse signal of a first sensing enable signal SAE. The first transistor 173 may include a p-channel field effect transistor (PFET). The second transistor 174 may provide a ground potential to the first inverter 171 and the second inverter 172. The second transistor 174 may operate based on the first sensing enable signal SAE. The second transistor 174 may include an n-channel field effect transistor (NFET). As the first transistor 173 and the second transistor 174 are turned on when the first sensing enable signal SAE is activated, and turned off when the first sensing enable signal SAE is inactivated, a leakage current may be reduced. A leakage current is generated from a bit line BL precharged with the first supply voltage.

The first inverter 171 and the second inverter 172 may be electrically connected between a first output node ON1 and a second output node ON2. The first output node ON1 may be electrically connected to a first pass transistor 175, and the second output node ON2 may be electrically connected to a second pass transistor 176. The first inverter 171 and the second inverter 172 are electrically connected to the first bit line SL and the second bit line SLb through the first pass transistor 175 and the second pass transistor 176, respectively. Each of the first pass transistor 175 and the second pass transistor 176 may include a structure in which two transistors are coupled. Each of the first pass transistor 175 and the second pass transistor 176 may include a structure in which an NFET and a PFET are coupled.

The output driver 180 may output data from an output of the read circuit 170. The output driver 180 may include a first buffer 181, a second buffer 182, and a third inverter 183. The output driver 180 may be electrically connected to the first output node ON1 and the second output node ON2 of the read circuit 170. Specifically, the first buffer 181 may be electrically connected to the second output node ON2, and the second buffer 182 may be electrically connected to the first output node ON1. The third inverter 183 may be electrically connected to the first buffer 181.

Figure 3:
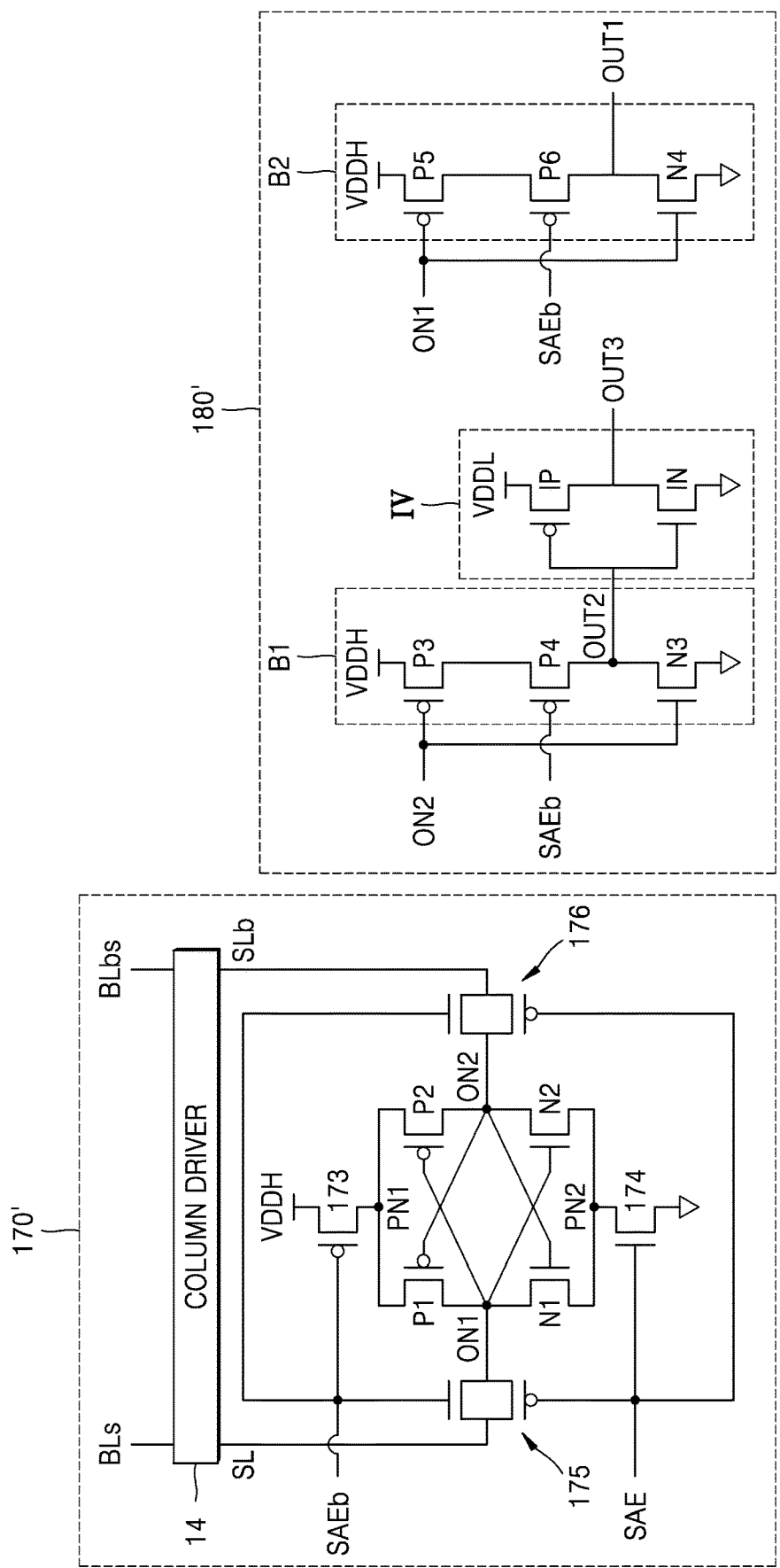
FIG. 3 is a circuit diagram illustrating a read circuit and an output driver according to an example embodiment.

FIG. 3 is a circuit diagram of a read circuit 170' and an output driver 180' according to an example embodiment. The read circuit 170' and the output driver 180' of FIG. 3 may be a circuit diagram further illustrating in detail the read circuit 170 and the output driver 180 according to FIG. 2. Hereinafter, FIG. 3 will be explained with reference to FIGS. 1 and 2.

The read circuit 170' may be electrically connected to at least one bit line selected by the column driver 14 from the plurality of bit lines BLs and at least one bit line bar selected by the column driver 14 from a plurality of bit line bars BLbs. The at least one bit line may include the first bit line SL and the second bit line SLb complementary to the first bit line SL.

The first bit line SL may be electrically connected to the first pass transistor 175. The first pass transistor 175 may be electrically connected to the first output node ON1. Both ends of the first pass transistor 175 may be electrically connected to the first bit line SL and the first output node ON1. The second bit line SLb may be electrically connected to the second pass transistor 176. The second pass transistor 176 may be electrically connected to the second output node ON2. Both ends of the second pass transistor 176 may be electrically connected to the second bit line SLb and the second output node ON2.

The read circuit 170' may include a first power node PN1 and a second power node PN2. A positive supply voltage may be applied to the first power node PN1, and a negative supply voltage or a ground potential may be applied to the second power node PN2. The read circuit 170' may include a pair of inverters which are cross coupled between the first power node PN1 and the second power node PN2, as in the read circuit 170 of FIG. 2. The first inverter of the cross-coupled inverter pair may include a first PFET P1 and a first NFET N1, and the second inverter may include a second PFET P2 and a second NFET N2. The first PFET P1 and the first NFET N1 may be electrically connected to the first output node ON1, and the second PFET P2 and the second NFET N2 may be electrically connected to the second output node ON2. Gates of the first PFET P1 and the first NFET N1 may be electrically connected to the second output node ON2, and gates of the second PFET P2 and the second NFET N2 may be electrically connected to the first output node ON1.

The output driver 180' may generate a data output from an output of the read circuit 170'. The output driver 180' may be electrically connected to the first output node ON1 and the second output node ON2 of the read circuit 170'. The output driver 180' may include a first buffer B1, a second buffer B2, and a third inverter IV.

The first buffer B1 may invert a voltage of the second output node ON2 based on the second supply voltage VDDH and an activated second sensing enable signal SAEb. The first buffer B1 may include a third PFET P3, a fourth PFET P4, and a third NFET N3. The voltage of the second output node ON2 may be applied to the third PFET P3 and the third NFET N3, and the activated second sensing enable signal SAEb may be applied to the fourth PFET P4. A second buffer output node OUT2 may be located between the fourth PFET P4 and the third NFET N3. The second buffer output node OUT2 may be electrically connected to the third inverter IV.

The third inverter IV may invert a voltage of the second buffer output node OUT2 based on the first supply voltage VDDL. The third inverter IV may include a seventh PFET IP and a fifth NFET IN that are electrically connected to the second buffer output node OUT2. The seventh PFET IP and the fifth NFET IN may be electrically connected to an inverter output node OUT3. As the first supply voltage VDDL may be applied to the seventh PFET IP, a final data output to the inverter output node OUT3 may be the first supply voltage VDDL level. The operation of the third inverter IV will be explained with reference to FIGS. 5A to 5C.

The second buffer B2 may invert a voltage of the first output node ON1 based on the second supply voltage VDDH and the activated second sensing enable signal SAEb. The second buffer B2 may include a fifth PFET P5, a sixth PFET P6, and a fourth NFET N4. The fifth PFET P5 and the fourth NFET N4 may be electrically connected to the first buffer output node OUT1. The voltage of the first output node ON1 may be applied to the fifth PFET P5 and the fourth NFET N4, and the activated second sensing enable signal SAEb may be applied to the sixth PFET P6. By electrically connecting the second buffer B2 to the first output node ON1, a loading difference between the first output node ON1 and the second output node ON2 of the read circuit 170' may be reduced.

In this detailed description, the transistors may have any structure. For example, the transistors may include a fin field effect transistor (FinFET) formed of active patterns extended in the form of a fin, and gate electrodes. The transistors may include a multi-bridge channel FET (MBCFET) formed of multiple nanosheets extended parallel to each other, and gate electrodes. The transistors may include a ForkFET including nanosheets for P type transistors and nanosheets for N type transistors. The ForkFET separates the nanosheets for P-type transistors and the nanosheets for N-type transistors by dielectric walls, allowing N-type transistors and P-type transistors to have a close structure. The transistors may include not only a field effect transistor (FET) such as a complementary FET (CFET), a negative FET (NCFET), a carbon nanotube FET (CNTFET), etc. but a bipolar junction transistor and other three-dimensional transistors.

Figure 4:
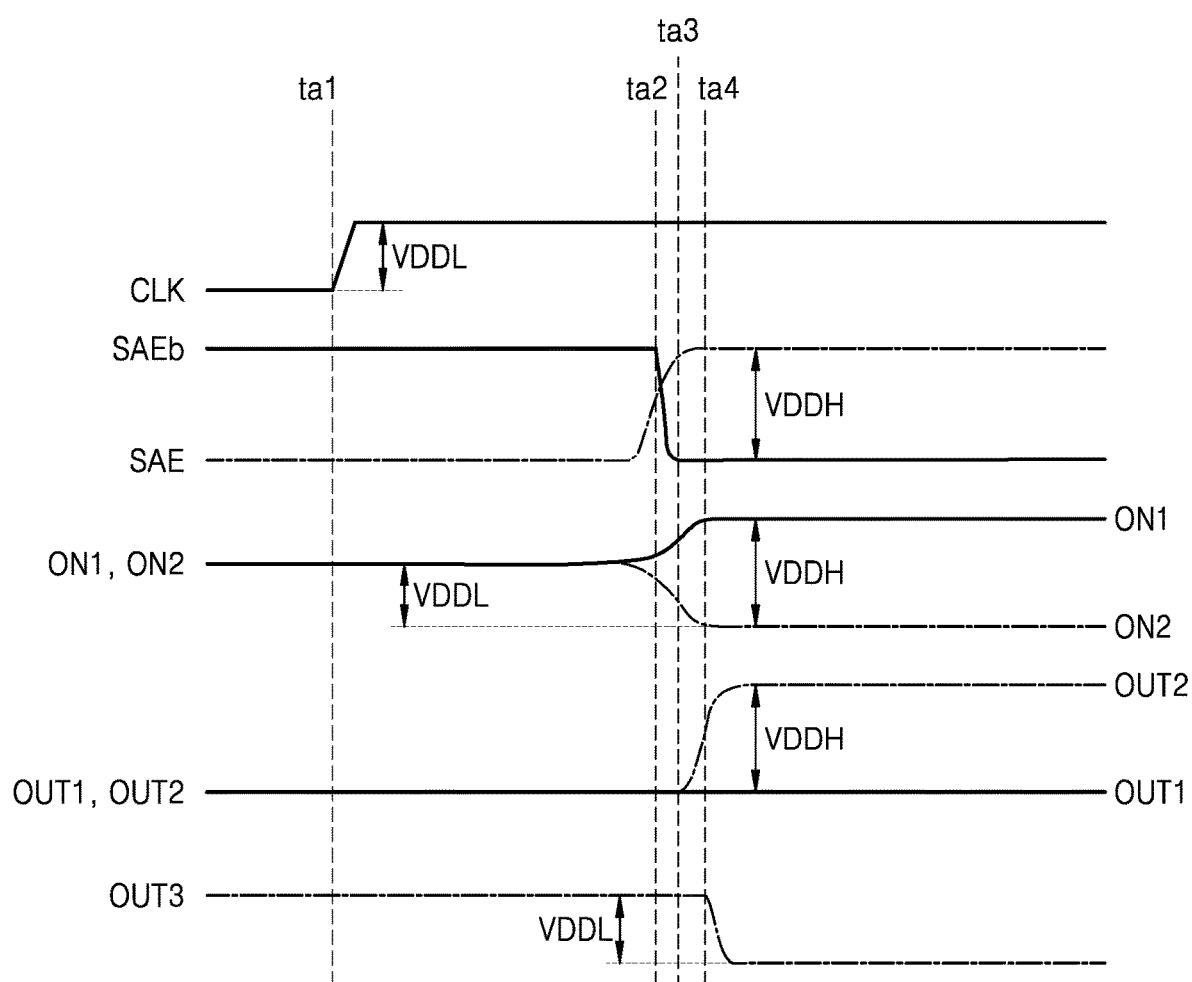
FIG. 4 is a graph showing levels of signals applied to a read circuit to read data according to an example embodiment.

FIG. 4 is a timing chart of a read operation according to an example embodiment. Specifically, the timing chart of FIG. 4 shows signals of the read circuit 170' and the output driver 180' of FIG. 3 in chronological order. In this detailed description, it is assumed that the signals are active high signals which have a high level when activated; however, example embodiments of the inventive concept are not limited thereto. Hereinafter, FIG. 4 will be explained with reference to FIGS. 1 to 3, and any redundant description regarding FIG. 4 will be omitted.

With reference to FIG. 4, the clock signal CLK may be activated at a time ta1. The clock signal CLK may be a signal input from the outside of the memory device 10 of FIG. 1. Thus, the clock signal CLK may have the level of the first supply voltage VDDL. As the time ta1 is before the first sensing enable signal SAE is activated, the first pass transistor 175 and the second pass transistor 176 may be in a turn-off state. Accordingly, as voltages of precharged first bit line SL and the second bit line SLb may be applied to the first output node ON1 and the second output node ON2, respectively, the first supply voltage VDDL may be applied to the first output node ON1 and the second output node ON2, respectively.

At a time ta2, the first sensing enable signal SAE may be activated. For example, the first control signal CTR1 of FIG. 1 may include the first sensing enable signal SAE, and the control logic 15 may activate the first sensing enable signal SAE based on the read command. In FIG. 1, as the read command is shifted by the level shifter 16, the first sensing enable signal SAE may have the level of the second supply voltage VDDH. The second sensing enable signal SAEb may be an inverse signal of the first sensing enable signal SAE. As the first sensing enable signal SAE is activated, the first pass transistor 175 and the second pass transistor 176 may be turned on. According to the activation of the first sensing enable signal SAE, the first transistor 173 and the second transistor 174 may be turned on. Therefore, the second supply voltage VDDH and the ground potential may be applied to the first inverter 171 and the second inverter 172 of FIG. 2. When the first inverter 171 and the second inverter 172 operate, high signals or low signals may be applied to the first output node ON1 and the second output node ON2 according to voltages of the first bit line SL and the second bit line SLb. A voltage difference between the first output node ON1 and the second output node ON2 may correspond to the second supply voltage VDDH level. The signals output through the first output node ON1 and the second output node ON2 may be transmitted to the first buffer B1 and the second buffer B2, respectively.

At a time ta3, the first buffer B1 and the second buffer B2 may receive and invert the signals output through the first output node ON1 and the second output node ON2. Specifically, the first buffer B1 may output a signal in which a voltage of the second output node ON2 is inverted through the second buffer output node OUT2, and the second buffer B2 may output a signal in which a voltage of the first output node ON1 is inverted at a voltage of the first buffer output node OUT1. Therefore, a high signal may be applied to the second buffer output node OUT2. A voltage difference between the first buffer output node OUT1 and the second buffer output node OUT2 may be the second supply voltage VDDH level.

At a time ta4, a low signal may be output to the inverter output node OUT3. The signal applied to the inverter output node OUT3 may be an inverse signal of a signal output from the second buffer output node OUT2. Because the third inverter IV of FIG. 3 operates based on the first supply voltage VDDL, the data output from the inverter output node OUT3 may have the first supply voltage VDDL.

Figure 5A:
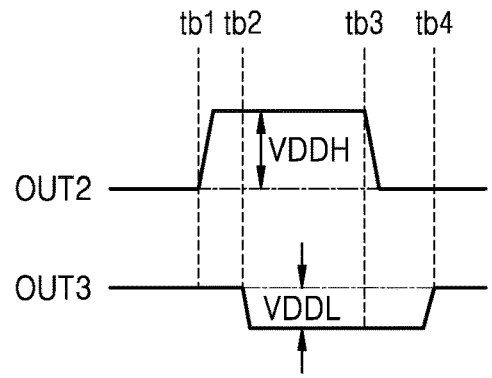
FIG. 5A is a graph showing levels of signals applied to an output driver according to an example embodiment.
Figure 5B:
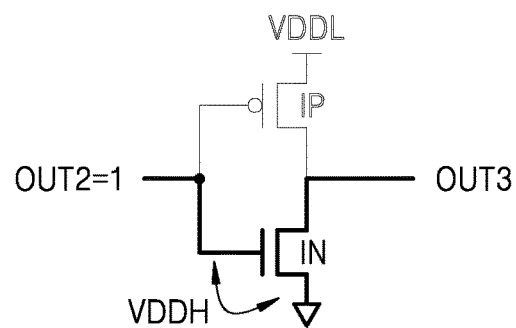
FIGS. 5B to 5C are circuit diagrams illustrating operations of the output driver according to FIG. 5A.
Figure 5C:
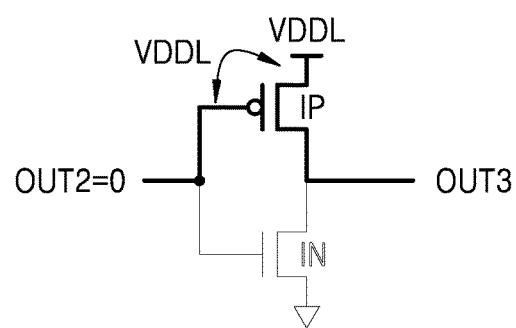

FIGS. 5A to 5C are diagrams showing the operation of the third inverter IV of FIG. 3. FIG. 5A is a graph showing levels of signals applied to the third inverter IV. FIG. 5B is a circuit diagram illustrating an operation when a high signal is applied to the third inverter IV, and FIG. 5C is a circuit diagram showing an operation when a low signal is applied to the third inverter IV. The third inverter IV may convert the voltage of the second buffer output node OUT2 to the voltage of the inverter output node OUT3 for output.

With reference to FIGS. 5A and 5B, a high signal may be applied to the third inverter IV at a time tb1. As signals output from the first buffer B1 are applied to the third inverter IV, the high signal applied to the third inverter IV may have the second supply voltage VDDH. As the high signal is applied (OUT2=1) to the third inverter IV, the seventh PFET IP of the third inverter IV may be turned off, and the fifth NFET IN may be turned on as illustrated, for example, in the circuit diagram FIG. 5B. Accordingly, at a time tb2, a low signal may be applied to the inverter output node OUT3. Because the third inverter IV operates based on the first supply voltage VDDL, the low signal may have the level of the first supply voltage VDDL.

With reference to FIGS. 5A and 5C, a low signal may be applied to the third inverter IV at a time tb3. As the low signal is applied (OUT2=0) to the third inverter IV, the seventh PFET IP of the third inverter IV may be turned on, and the fifth NFET IN may be turned off as illustrated, for example, in the circuit diagram FIG. 5C. Accordingly, at a time tb4, a high signal may be applied to the inverter output node OUT3. The seventh PFET IP may operate based on the first supply voltage VDDL.

According to this embodiment, when the high signal is applied (OUT2=1) to the third inverter IV at the time tb1, the fifth NFET IN is controlled by the second supply voltage VDDH, allowing a faster data output. Accordingly, the reading speed of the memory device may be increased.

Figure 6:
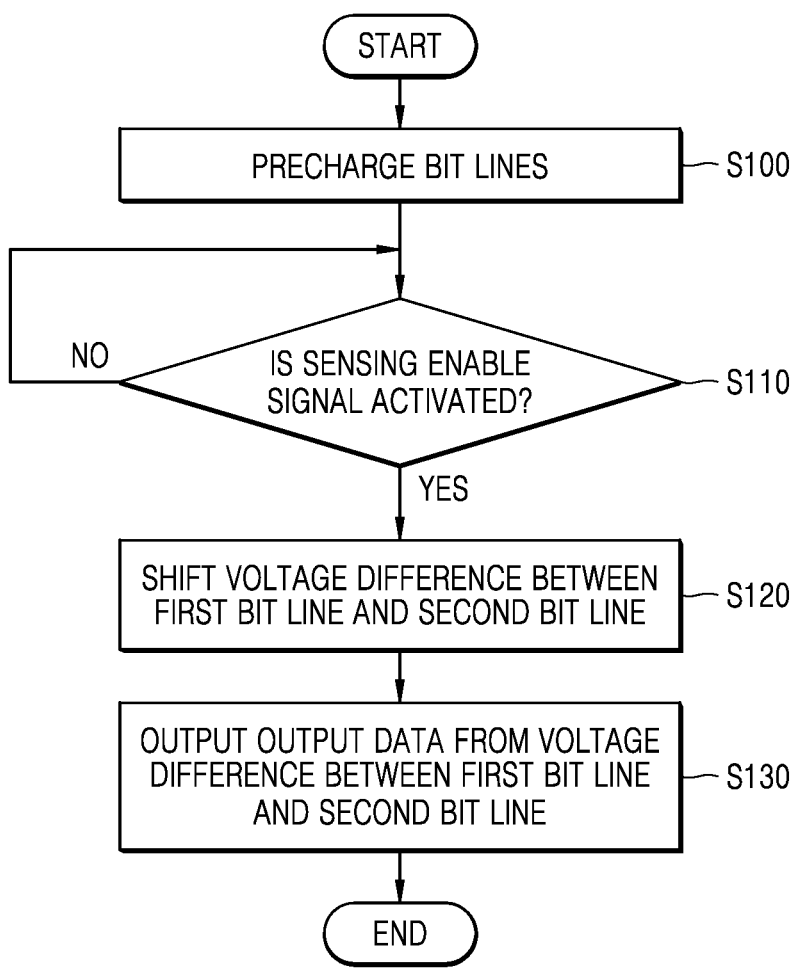
FIG. 6 is a flowchart illustrating a read operation of a memory device according to an example embodiment.

FIG. 6 is a flowchart illustrating a read operation of a memory device according to an example embodiment. Specifically, the flowchart of FIG. 6 shows an example of read operation performed in a memory device. As shown in FIG. 6, the operating method of the memory device may include multiple operations S100, S110, S120, and S130. In some embodiments, the method of FIG. 6 may be performed by the bit line precharge circuit 13, the read circuit 17, and the output driver 18 of FIG. 1, and FIG. 6 will be explained with reference to FIGS. 1 to 4 below.

With reference to FIG. 6, the bit lines may be precharged in operation S100. The bit lines may be precharged based on the first supply voltage. Operation S100 may be performed in the bit line precharge circuit 13 of FIG. 1.

In operation S110, it may be determined whether a sensing enable signal is activated. For example, it may be determined whether the sensing enable signal is activated through the control logic 15. The sensing enable signal may refer to the first sensing enable signal SAE having a high level when activated.

In operation S120, a voltage difference between the precharged first bit line SL and the second bit line SLb may be shifted based on the activated enable signal. For example, the voltage difference between the first bit line SL and the second bit line SLB may be shifted from the first supply voltage VDDL to the second supply voltage VDDH. As the voltage difference between the first bit line SL and the second bit line SLB is shifted, the read operation of the memory device may be performed in a fast and stable manner. Operation S120 may be performed through the read circuit 17 of FIG. 1.

In operation S130, output data may be output from the shifted voltage difference between the first bit line SL and the second bit line SLb. For example, the output data may be data in which the voltage difference of the second bit line SLb is inverted and then converted into the first supply voltage VDDL level. The first supply voltage VDDL may be a voltage at which circuits outside the memory device operate. Operation S130 may be performed through the read driver 18 of FIG. 1.

In this embodiment, by shifting the voltage difference between the first bit line SL and the second bit line SLb through the read circuit 17 of FIG. 1, the read operation of the memory device may be performed in a fast and stable manner. For example, by shifting the voltage difference between the first bit line SL and the second bit line SLb through the read circuit 17, parasitic elements may be reduced. Further, as the precharging of the bit lines BLs is performed based on the first supply voltage, the energy consumption may be reduced.

Figure 7:
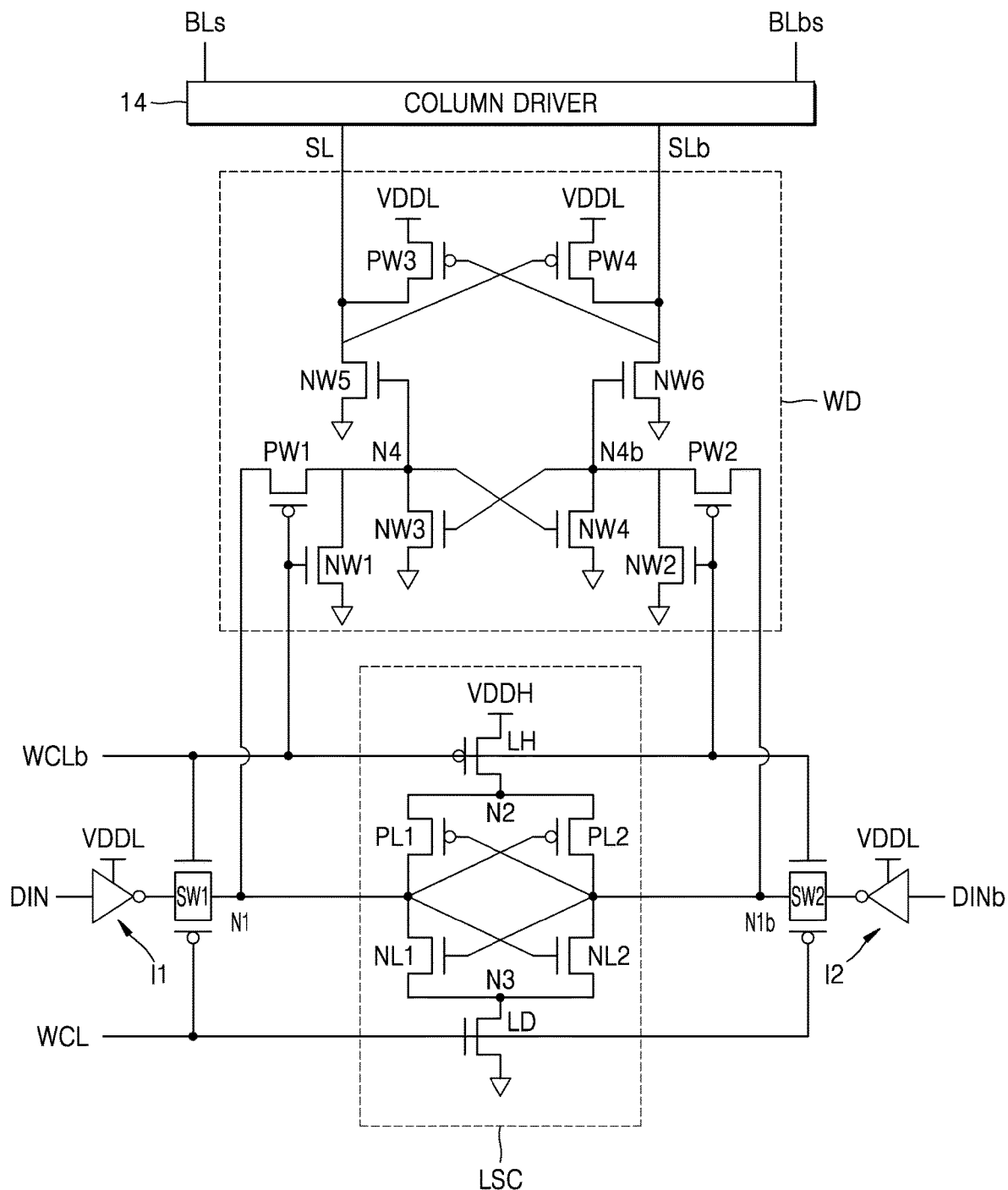
FIG. 7 is a circuit diagram illustrating a write circuit according to an example embodiment.

FIG. 7 is a circuit diagram illustrating the write circuit 19 of FIG. 1. The data may be written to the cell array 11 of FIG. 1 through the write circuit 19. The write circuit 19 may operate based on the second supply voltage VDDH, and may include a level shifting circuit LSC and a write driver WD.

The level shifting circuit LSC and the write driver WD may respond to a write pulse WCL. The write pulse WCL may be generated based on a pulse signal generated based on a clock signal CLK, and a write enable signal. In FIG. 1, the second control signal CTR2 may include the write pulse WCL. The write pulse WCL may have the level of the second supply voltage VDDH. The write pulse WCL may be an active high signal having a high level when activated. An inverse write pulse WCLb may be an inverse signal of the write pulse WCL.

First write data DIN corresponding to the write data DATA_IN and second write data DINb corresponding to an inverted version of the write data DATA_IN of FIG. 1 may be input to the level shifting circuit LSC. The second write data DINb may be an inverted version of the first write data DIN. The first write data DIN may be input to the level shifting circuit LSC through a first write inverter I1, and the second write data DINb may be input to the level shifting circuit LSC through a second write inverter I2. The first write inverter I1 and the second write inverter I2 may operate based on the first supply voltage VDDL.

A first switch transistor SW1 may be between the first write inverter I1 and the level shifting circuit LSC. A second switch transistor SW2 may be between the second write inverter I2 and the level shifting circuit LSC. The first switch transistor SW1 and the second switch transistor SW2 may operate based on the write pulse WCL and the inverse write pulse WCLb. For example, when the write pulse WCL is activated, the first switch transistor SW1 and the second switch transistor SW2 may be turned off.

The level shifting circuit LSC may be connected between the first switch transistor SW1 and the second switch transistor SW2. The level shifting circuit LSC may include a first node N1 electrically connected to the first switch transistor SW1 and a first inverse node N1b electrically connected to the second switch transistor SW2. As the first switch transistor SW1 and the second switch transistor SW2 are turned on before the write pulse WCL is activated, the first write data DIN and the second write data DINb are inverted to generate inverse signals by the first write inverter I1 and the second write inverter I2, and the inverse signals may be transmitted to the first node N1 and the first inverse node N1b. After the write pulse WCL is activated, the first switch transistor SW1 and the second switch transistor SW2 are turned off, and accordingly, the level shifting circuit LSC may operate and shift an inverse signal level of the first write data DIN and the second write data DINb transmitted to the first node N1 and the first inverse node N1b. Thus, the inverse signal level of the first write data DIN and the second write data DINb may be shifted from the first supply voltage VDDL level to the second supply voltage VDDH level.

The level shifting circuit LSC may include a first LS PFET PL1, a second LS PFET PL2, a first LS NFET NL1, and a second LS NFET NL2. The first node N1 may be between the first LS PFET PL1 and the first LS NFET NL1, and the first inverse node N1b may be between the second LS PFET PL2 and the second LS NFET NL2. Gates of each of the first LS PFET PL1 and the first LS NFET NL1 may be electrically connected to the first inverse node N1b, and gates of each of the second LS PFET PL2 and the second LS NFET NL2 may be electrically connected to the first node N1. Thus, an inverter including the first LS PFET PL1 and the first LS NFET NL1 may be crossed coupled with an inverter including the second LS PFET PL2 and the second LS NFET NL2. Each of the first LS PFET PL1 and the second LS PFET PL2 may be electrically connected to the second node N2 to which the second supply voltage VDDH is applied, and the first LS NFET NL1 and the second LS NFET NL2 may be electrically connected to the third node N3 to which the ground potential is applied.

The second node N2 may be electrically connected to a first LS transistor LH. The first LS transistor LH may operate based on the inverse write pulse WCLb. The first LS transistor LH may provide a positive supply voltage to the second node N2. The positive supply voltage may include the second supply voltage VDDH. As the first LS transistor LH is turned on only when the write pulse WCL is activated, a leakage current which is generated when the level shifting circuit LSC does not operate may be broken. The third node N3 may be electrically connected to a second LS transistor LD. The second LS transistor LD may operate based on the write pulse WCL. The second transistor 174 may provide a negative supply voltage or a ground potential to the third node N3.

The level shifting circuit LSC may shift an inverse signal of the first write data DIN and the second write data DINb, having the first supply voltage VDDL or the ground potential to a signal having the level of the second supply voltage VDDH or the ground potential. For example, a voltage difference between the first write data DIN and the second write data DINb, having the level of the first supply voltage VDDL or the ground potential may be shifted to a voltage difference having the level of the second supply voltage VDDH. The voltage difference of the second supply voltage VDDH may refer to a level difference in signals output through the first node N1 and the first inverse node N1b after the write pulse WCL is activated. The inverse signal of the first write data DIN and the second write data DINb may be referred to as a "first differential signal," and the signals output through the first node N1 and the first inverse node N1b after the write pulse WCL is activated may be referred to as a "second differential signal."

The second differential signal generated from the level shifting circuit LSC may be provided to the write driver WD. The write driver WD may be electrically connected to at least one bit line selected by the column driver 14 from a plurality of bit lines BLs and at least one bit line bar selected by the column driver 14 from a plurality of bit line bars BLbs. The at least one bit line may include the first bit line SL, and the at least one bit line bar may include the second bit line SLb. The second bit line SLb may be complementary to the first bit line SL.

The write driver WD may include a first WD PFET PW1, a first WD NFET NW1, a second WD PFET PW2, and a second WD NFET NW2. The first WD PFET PW1, the first WD NFET NW1, the second WD PFET PW2, and the second WD NFET NW2 may operate based on the inverse write pulse WCLb. For example, as the inverse write pulse WCLb is a signal to which the write pulse WCL is inverted, when the write pulse WCL is activated, the first WD PFET PW1 and the second WD PFET PW2 may be turned on, and the first WD NFET NW1 and the second WD NFET NW2 may be turned off.

As the first WD PFET PW1 and the second WD PFET PW2 are turned on when the write pulse WCL is activated, the second differential signals may be transmitted to a fourth node N4 and a fourth inverse node N4b after the write pulse WCL is activated. Accordingly, the second supply voltage VDDH or the ground voltage may be applied to the fourth node N4 and the fourth inverse node N4b. The fourth node N4 may be electrically connected to the third WD NFET NW3, and the fourth inverse node N4b may be electrically connected to the fourth WD NFET NW4. In addition, the gate of the third WD NFET NW3 may be electrically connected to the fourth inverse node N4b, and the gate of the fourth WD NFET NW4 may be electrically connected to the fourth node N4.

The write driver WD may include the third WD PFET PW3 and the fourth WD PFET PW4. The gate of the third WD PFET PW3 may be electrically connected to the second bit line SLb, and the gate of the fourth WD PFET PW4 may be electrically connected to the first bit line SL.

The write driver WD may include a fifth WD NFET NW5 and a sixth WD NFET NW6. The gate of the fifth WD NFET NW5 may be electrically connected to the fourth node N4, and a current terminal may be electrically connected to the first bit line SL and the ground. The gate of the sixth WD NFET NW6 may be electrically connected to the fourth inverse node N4B, and the current terminal may be electrically connected to the second bit line SLb and the ground. The fifth WD NFET NW5 and the sixth WD NFET NW6 may be used to provide signals to the first bit line SL and the second bit line SLb. The fifth WD NFET NW5 and the sixth WD NFET NW6 may generate a signal having the first supply voltage VDDL or the ground potential based on the second differential signals, and then provide the signal to the first bit line SL and the second bit line SLb. For example, when a high signal is applied to the fourth node N4, and a low signal is applied to the fourth inverse node N4b, the fifth WD NFET NW5 is turned on, and the sixth WD NFET NW6 is turned off. Accordingly, the fourth WD PFET PW4 whose gate is electrically connected to the first bit line SL is turned off, and the third WD PFET PW3 whose gate is electrically connected to the second bit line SLb is turned on, allowing the first supply voltage VDDL to be applied to the first bit line SL. The signals having the first supply voltage VDDL or the ground potential and generated based on the second differential signals may be referred to as a "third differential signal." The third differential signal may be provided to the first bit line SL and the second bit line SLb.

In this embodiment, as the second supply voltage VDDH is applied to the gate of the fifth WD NFET NW5 or the sixth WD NFET NW6, the write operation may be performed in an accurate and faster manner. For example, by shifting the voltage difference between the first bit line SL and the second bit line SLb through the write circuit 19, parasitic elements may be reduced.

Figure 8:
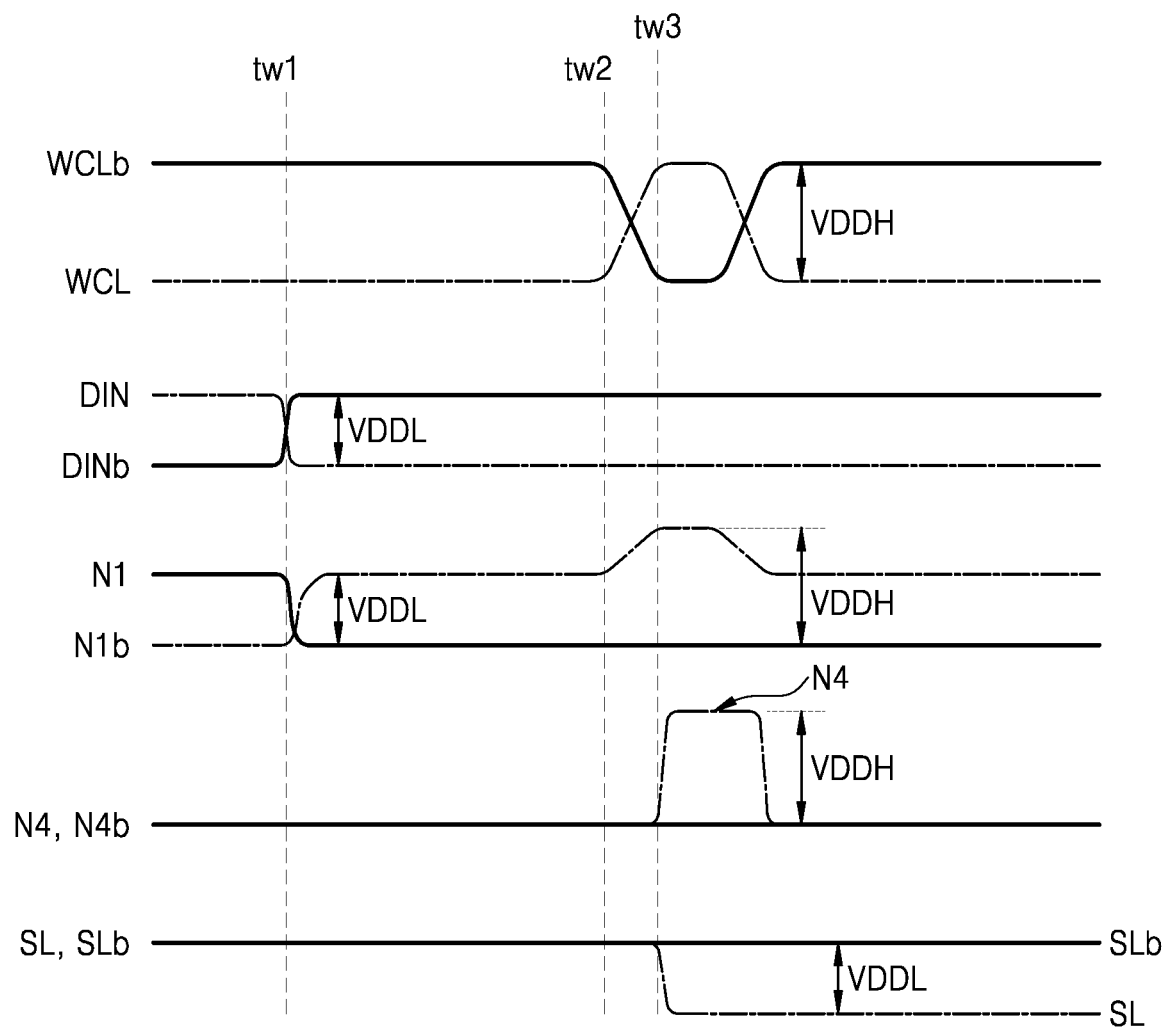
FIG. 8 is a graph showing levels of signals applied to a write circuit according to an example embodiment.

FIG. 8 is a timing chart of a write operation according to an example embodiment. Specifically, the timing diagram of FIG. 8 shows the signals of the write circuit of FIG. 7 in chronological order. In this detailed description, it is assumed that the signals are active high signals which have a high level when activated; however, example embodiments of the inventive concept are not limited thereto. Hereinafter, FIG. 8 will be explained with reference to FIGS. 1 and 7, and any redundant description regarding FIG. 8 will be omitted.

With reference to FIG. 8, the first write data DIN and the second write data DINb may be input at a time tw1. The first write data DIN and the second write data DINb may be input as signals inverted by the first write inverter I1 and the second write inverter 12. As the write pulse WCL is not activated at the time tw1, the inverse signals of the first write data DIN and the second write data DINb may be provided to the first node N1 and the first inverse node N1b. A level difference between the first write data DIN and the second write data DINb may be the level of the first supply voltage VDDL.

The write pulse WCL may be activated at a time tw2. For example, the second control signal CTR2 of FIG. 1 may include the write pulse WCL, and the control logic 15 may activate the write pulse WCL based on a write command. According to the activation of the write pulse WCL, the level shifting circuit LSC may operate based on the second supply voltage VDDH. Accordingly, signals having the level of the second supply voltage VDDH or the ground voltage may be applied to the first node N1 and the first inverse node N1b. For example, a level difference between the signals having the level of the first supply voltage VDDL or the ground voltage may be shifted to a level difference between the signals having the level of the second supply voltage VDDH or the ground voltage.

In response to the write pulse WCL at a time tw3, the signals having the level of the second supply voltage VDDH or the ground potential may be transmitted to the fourth node N4 and the fourth inverse node N4b. Accordingly, signals having the level of the first supply voltage VDDL or the ground potential may be generated and provided to the first bit line SL and the second bit line SLb.

In this embodiment, as the signals having the level of the first supply voltage VDDL or the ground voltage are provided to the first bit line SL and the second bit line SLb, the power consumption required for a write operation may be reduced, and as the operation for providing the signals having the level of the first supply voltage VDDL or the ground voltage to the first bit line SL and the second bit line SLb may be performed based on the second supply voltage VDDH, the write operation may be performed quickly.

Figure 9:
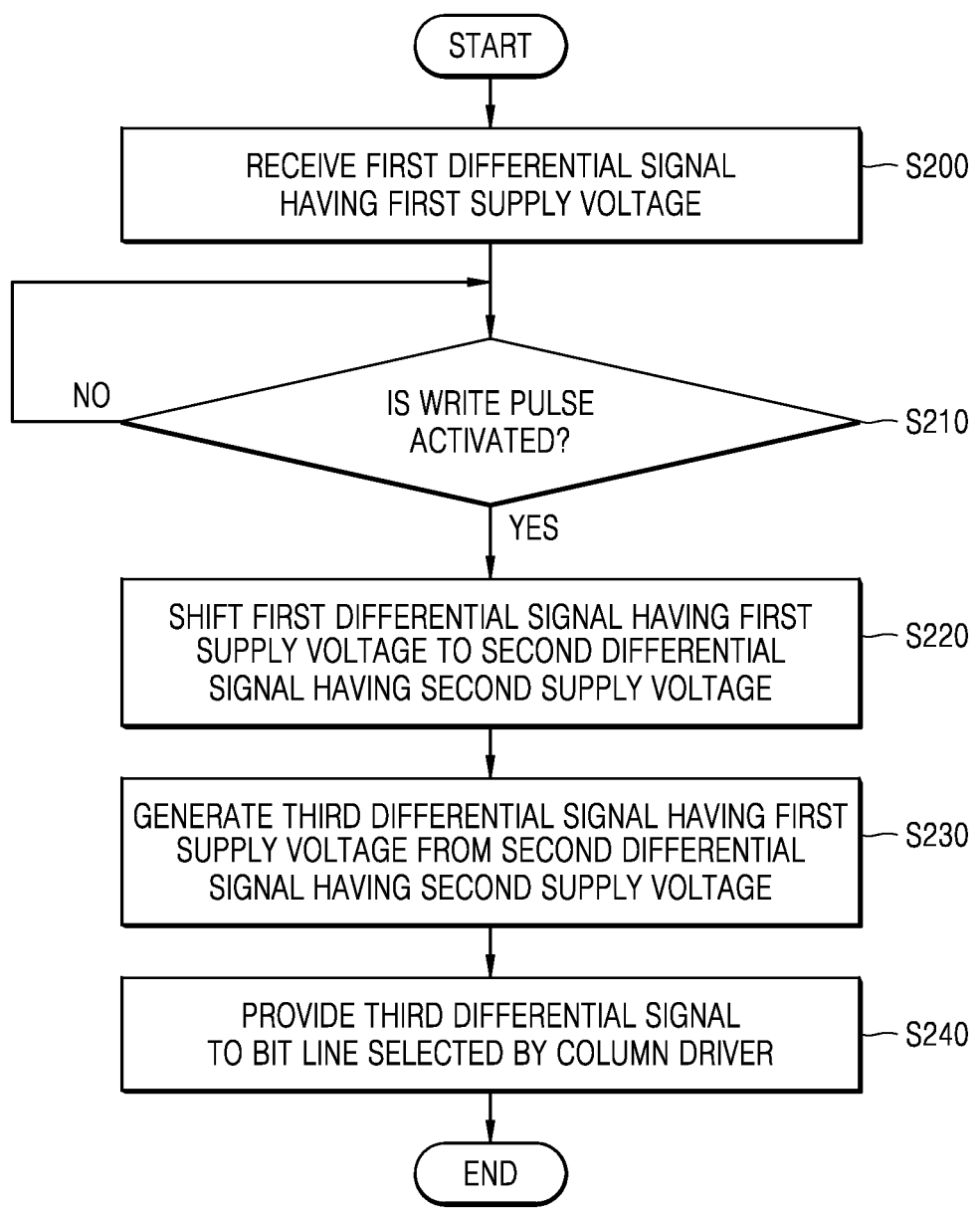
FIG. 9 is a flowchart illustrating a write operation of a memory device according to an example embodiment.

FIG. 9 is a flowchart illustrating a write operation of a memory device according to an example embodiment. Specifically, the flowchart of FIG. 9 shows an example of a write operation performed in a memory device. As shown in FIG. 9, the operating method of the memory device may include multiple operations S200, S210, S220, S230 and S240. In some embodiments, the method of FIG. 9 may be performed by the write circuit 19 of FIG. 1, and FIG. 9 will be described with reference to FIGS. 1 and 7.

With reference to FIG. 9, the write data DATA_IN may be received in operation S200. The first write data DIN corresponding to the write data DATA_IN and the second write data DINb corresponding to an inverted version of the write data DATA_IN may be input. The "first differential signal" may include a signal in which the first write data DIN and the second write data DINb is inverted respectively. Thus, the first differential signal may have a signal having the level of the first supply voltage VDDL and a signal having the ground potential.

The write pulse WCL may be activated in operation S210. For example, the write pulse WCL may be activated through the control logic 15. The write pulse WCL may refer to a signal having a high level when activated.

In operation S220, based on the activated write pulse WCL, the first differential signal having the level of the first supply voltage VDDL or the ground potential may be shifted to the second differential signal having the level of the second supply voltage VDDH or the ground potential. Operation S220 may be performed through the level shifting circuit LSC of FIG. 7.

In operation S230, a third differential signal having the level of the first supply voltage VDDL or the ground potential may be generated from the shifted second differential signal. Operation S230 may be performed through the write driver WD of FIG. 7.

In operation S240, the third differential signal may be provided to at least one bit line selected by the column driver 14. In this embodiment, by shifting an inverse signal of write data through the write circuit 19, the write operation of the memory device may be performed quickly. In addition, a memory device which requires lower energy consumption when performing a write operation may be provided.

Figure 10:
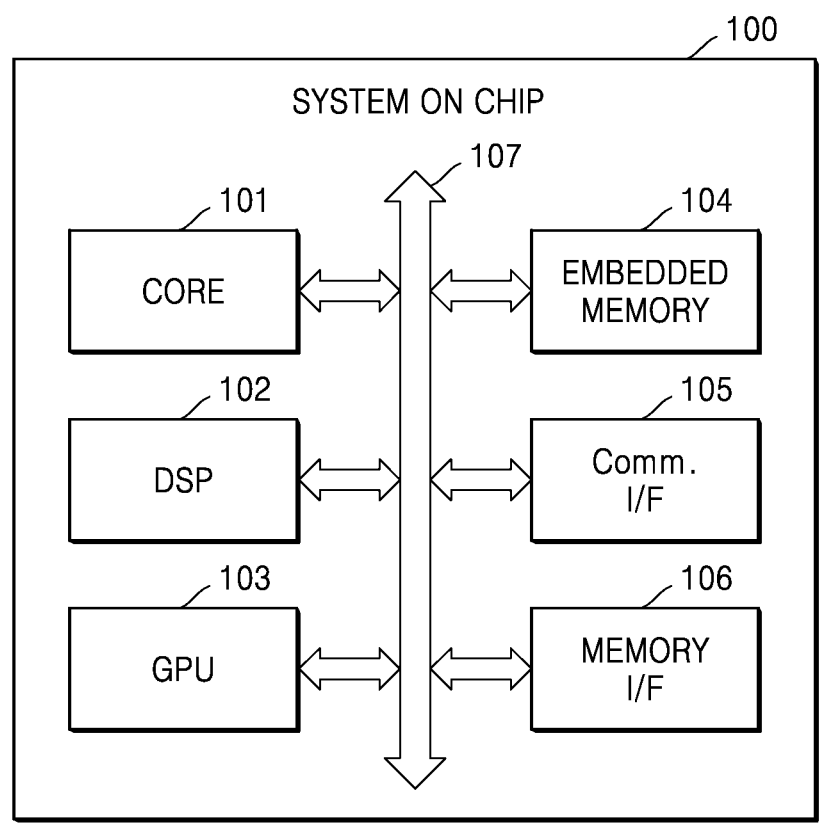
FIG. 10 is a block diagram of a System-on-Chip (SoC) according to an example embodiment.

FIG. 10 is a block diagram of a System-on-Chip (SoC) 100 according to an example embodiment. The SoC 100 may refer to an integrated circuit in which components of computing systems or other electronic systems are integrated. For example, as an example of the SoC 100, an application processor (AP) may include processors and components for other functions. As shown in FIG. 10, the SoC 100 may include a core 101, a digital signal processor (DSP) 102, a graphics processing unit (GPU) 103, an embedded memory 104, a communication interface 105 and a memory interface 106. The components of the SoC 100 may communicate with each other through a bus 107. The components of the SoC 100 may operate based on the first supply voltage.

The core 101 may process commands and control operations of the components included in the SoC 100. For example, by processing a series of commands, the core 101 may drive an operating system and execute applications on the operating system. The DSP 102 may generate useful data by processing digital signals e.g., a digital signal provided from the communication interface 105. The GPU 103 may generate data for an image output by a display device from image data provided from the embedded memory 104 or the memory interface 106, or may encode the image data. In some embodiments, the memory device described with reference to the drawings may be included as a cache memory and/or a buffer in the core 101, the DSP 102, and/or the GPU 103. Accordingly, due to a high reliability and efficiency of the memory device, the core 101, the DSP 102, and/or the GPU 103 may also have a high reliability and efficiency.

The embedded memory 104 may store data necessary for the core 101, the DSP 102, and the GPU 103 to operate. In some embodiments, the embedded memory 104 may include the aforementioned memory device described with reference to the drawings. Accordingly, the embedded memory 104 may provide a reliable write operation with reduced area and power consumption, and as a result, the operation reliability and efficiency of the SoC 100 may be increased.

The communication interface 105 may provide an interface for a communication network or one-to-one communication. The memory interface 106 may provide an interface for an external memory of the SoC 100, such as dynamic random access memory (DRAM), flash memory, etc.

While the inventive concept has been particularly shown and described with reference to embodiments thereof, it will be understood that various changes in form and details may be made therein without departing from the spirit and scope of the following claims.

What is claimed is:

1. A memory device accessed by circuits operating based on a first supply voltage, the memory device comprising:
a cell array electrically connected to a plurality of word lines and a plurality of bit lines;
a row driver configured to select one of the plurality of word lines based on a row address;
a precharge circuit configured to precharge the plurality of bit lines based on the first supply voltage;
a column driver configured to select a first bit line from the plurality of bit lines based on a column address; and
a read circuit configured to read data stored in the cell array through the first bit line; and
a control logic configured to generate the row address and the column address,
wherein the cell array, the row driver, the column driver, the read circuit and the control logic are configured to operate based on a second supply voltage, which is higher than the first supply voltage,
wherein the read circuit comprises a sense amplifier electrically connected to the first bit line and a second bit line complementary to the first bit line, from among the plurality of bit lines, and
wherein, when reading data stored in the cell array, the read circuit is configured to
shift a voltage difference between the first bit line and the second bit line from the first supply voltage to the second supply voltage,
output the shifted voltage difference as a first output signal and a second output signal, which is an inverse signal of the first output signal,
invert the first output signal and the second output signal based on the second supply voltage, and
invert the second output signal based on the first supply voltage.

2. The memory device of claim 1,
wherein the sense amplifier comprises:
a first inverter and a second inverter, which are cross coupled between a first output node and a second output node;
a first transistor configured to provide the second supply voltage to the first inverter and the second inverter based on a first enable signal; and
a second transistor configured to provide a ground potential to the first inverter and the second inverter based on a second enable signal.

3. The memory device of claim 2, wherein the second enable signal is an inverse signal of the first enable signal.

4. The memory device of claim 2, further comprising:
an output driver configured to generate a data output from an output of the read circuit,
wherein the output driver comprises:
a first buffer configured to invert a voltage of the first output node based on the second supply voltage and an activated first enable signal; and
a third inverter configured to invert an output of the first buffer based on the first supply voltage.

5. The memory device of claim 4, wherein the output driver further comprises a second buffer configured to invert a voltage of the second output node based on the second supply voltage and the activated first enable signal.

6. An operating method of a memory device accessed by circuits operating based on a first supply voltage, the operating method comprising:
precharging a plurality of bit lines electrically connected to a cell array based on the first supply voltage;
selecting one of a plurality of word lines electrically connected to the cell array based on a second supply voltage, which is higher than the first supply voltage;
selecting at least one bit line from the plurality of bit lines based on the second supply voltage; and
reading data from the cell array through the at least one bit line based on the second supply voltage,
wherein the reading data from the cell array further comprises
shifting a voltage difference between a first bit line and a second bit line complementary to the first bit line of the at least one bit line, from the first supply voltage to the second supply voltage,
outputting the shifted voltage difference as a first output signal and a second output signal, which is an inverse signal of the first output signal,
inverting the first output signal and the second output signal based on the second supply voltage, and
inverting the second output signal based on the first supply voltage.

* * * * *